(12) United States Patent
Shin et al.

(10) Patent No.: US 9,077,147 B2
(45) Date of Patent: Jul. 7, 2015

(54) BURST OSCILLATION METHOD IN LASER SYSTEM AND APPARATUS FOR SAME

(75) Inventors: Woojin Shin, Gwangju (KR);
Young-Chul Noh, Gwangju (KR);
Bong-Ahn Yu, Gwangju (KR); Yeung Lak Lee, Gwangju (KR)

(73) Assignee: Gwangju Institute of Science and Technology, Gwangju (KR)

(*) Notice: Subject to any disclaimer, the term of this patent is extended or adjusted under 35 U.S.C. 154(b) by 167 days.

(21) Appl. No.: 13/703,695

(22) PCT Filed: Oct. 12, 2011

(86) PCT No.: PCT/KR2011/007586
§ 371 (c)(1),
(2), (4) Date: Dec. 12, 2012

(87) PCT Pub. No.: WO2012/050363
PCT Pub. Date: Apr. 19, 2012

(65) Prior Publication Data
US 2013/0215494 A1    Aug. 22, 2013

(30) Foreign Application Priority Data
Oct. 13, 2010    (KR) .................. 10-2010-0099914

(51) Int. Cl.
*H01S 3/11* (2006.01)
*H01S 3/23* (2006.01)
*H01S 5/062* (2006.01)
*B23K 26/06* (2014.01)
*H01S 3/00* (2006.01)

(52) U.S. Cl.
CPC ............... *H01S 3/11* (2013.01); *H01S 3/2316* (2013.01); *H01S 3/2375* (2013.01); *H01S 5/06216* (2013.01); *H01S 3/0092* (2013.01); *B23K 26/063* (2013.01)

(58) Field of Classification Search
USPC ........................ 359/326–332; 372/21–22
See application file for complete search history.

(56) References Cited

U.S. PATENT DOCUMENTS

| 6,014,249 | A  | * | 1/2000 | Fermann et al. | ........... 359/341.1 |
| 7,529,281 | B2 | * | 5/2009 | Leonardo et al. | ................ 372/22 |
| 7,924,892 | B2 | * | 4/2011 | Chuang et al. | .................... 372/6 |

(Continued)

FOREIGN PATENT DOCUMENTS

JP    2010003771 A    1/2010
KR    20100017857 A    2/2010

OTHER PUBLICATIONS

International Application No. PCT/KR2011/007586, International Search Report dated May 21, 2012, five (5) pages.

*Primary Examiner* — Daniel Petkovsek
(74) *Attorney, Agent, or Firm* — Nath, Goldberg & Meyer; Joshua B. Goldberg; Katelyn J. Bernier

(57) ABSTRACT

Disclosed is a burst mode oscillation method for burst mode oscillation by controlling the peak output of light pulses in a laser system. The burst mode oscillation apparatus includes a seed beam generator which receives electrical input signals having different pulse widths, modulates pulse widths and amplitudes of outputs in output light according to the received electrical input signals, and outputs the modulated pulse light, an amplifier which amplifies the modulated pulse light and outputs amplified pulse light, and a non-linear wavelength converter which can control wavelength-converted output light according to the amplitudes of the peak output changed through the pulse widths of the amplified pulse light.

6 Claims, 5 Drawing Sheets

(56) References Cited

U.S. PATENT DOCUMENTS

| | | | |
|---|---|---|---|
| 8,009,705 B2* | 8/2011 | Keaton et al. | 372/6 |
| 8,160,113 B2* | 4/2012 | Adams et al. | 372/25 |
| 8,509,270 B2* | 8/2013 | Harter et al. | 372/6 |
| 2004/0032887 A1 | 2/2004 | Ahmadvand et al. | |
| 2009/0185588 A1* | 7/2009 | Munroe | 372/22 |
| 2010/0128744 A1 | 5/2010 | Deladurantaye et al. | |
| 2011/0211184 A1* | 9/2011 | Tokuhisa et al. | 355/67 |

* cited by examiner

BURST OSCILLATION METHOD IN LASER SYSTEM AND APPARATUS FOR SAME

This is a National Phase Application filed under 35 U.S.C. 371 as a national stage of PCT/KR2011/007586, filed Oct. 12, 2011, and claiming the benefit from Korean Application No. 10-2010-0099914, filed Oct. 13, 2010, the content of each of which is hereby incorporated by reference in its entirety.

TECHNICAL FIELD

The present invention relates to a burst mode oscillation method in a laser system and an apparatus for the same, and more particularly, to a burst mode oscillation method, by which a burst mode is oscillated by controlling peak outputs in a laser system, and an apparatus for the same.

BACKGROUND ART

Laser processing technology has been gradually developing toward ultra-precision, ultra high-speed, and large scale for processing of precision components in the electronics industry. In particular, ultra-precision processing is required for processing parts in the field of microelectronics including semiconductors, displays, solar cells, next-generation high value/high performance PCBs, and next-generation packages.

For such ultra-precision processing at micro-scale, high laser performance is also required. In order to achieve ultra-precision processing, a method using a laser beam in an ultraviolet region or an ultra-short pulse laser beam of a short pulse width is employed. In addition, a pulse laser having high repetition rate and high output is also required for high speed and large scale laser processing.

However, since current pulse lasers employ a very complex optical system, cannot achieve high repetition rate and high output, and have lower operation stability than existing ultraviolet nanosecond pulse lasers, the pulse laser does not have industrial applicability. Thus, an ultraviolet (UV) laser having high output and high repetition rate is needed as a light source for ultra-precision/high speed processing.

Generally, a UV laser system produces an infrared laser beam of high output and oscillates the infrared laser beam into a UV laser beam through nonlinear wavelength conversion. To this end, the laser system converts output pulses having the same interval generated in an oscillator into desired time-based output pulses (burst mode) through time-based selection using various forms of optical modulators. Hereinafter, an internal structure of a bust mode oscillating apparatus of a typical laser system will be described with reference to FIG. 1.

FIG. 1 is a block diagram of an internal structure of a burst mode oscillation apparatus of a typical laser system.

Referring to FIG. 1, the burst mode oscillation apparatus include an oscillator 101, a main amplifier 102, an optical modulator 103, and a nonlinear wavelength converter 104. The oscillator 101 receives an electrical signal including pulse widths of the same size, oscillates output light in a pulse unit from the received electrical signal, and transmits the oscillated output light to the main amplifier 102. The main amplifier 102 amplifies the pulse light oscillated by the oscillator 101, and transmits the amplified pulse light to the optical modulator 103.

The optical modulator 103 optically modulates the pulse light amplified by the main amplifier 102, and outputs the optically modulated light. Here, since the optical modulator 103 selects pulse signals generated by the oscillator 101 and the main amplifier 102 based on time, and outputs only the pulse signals corresponding to selected times, only a time-based pulse output control can be allowed. Further, since the optical modulator 103 can control the characteristics of output pulses having only an oscillating frequency or lower, a basic pulse width to be output cannot be varied.

In addition, when the optical modulator 103 varies pulse signals amplified by the oscillator 101 and the main amplifier 102 at a relatively low repetition rate, since temporarily high light signals are generated per unit time due to a low repetition rate by a rear optical amplifier, various optical parts constituting an optical amplifier are physically damaged, thereby making it difficult to freely vary the pulse repetition rate. Moreover, the optical modulator 103 must be additionally installed outside a laser oscillator, thereby significantly increasing installation costs. The nonlinear wavelength converter 104 receives a pulse signal optically modulated by the optical modulator 103, converts the wavelength of the received optically modulated pulse, and outputs light having the converted wavelength.

To solve such problems in the art, a master oscillator power amplification (MOPA) technology is introduced. MOPA employs a main oscillator and an amplifier in order to directly modulate time characteristics of light using a semiconductor laser and amplify the modulated light into high output signals. MOPA provides an advantage of facilitating modulation of pulse widths and frequency modulation, but has problems of output stability of a laser system and physical damage of the amplifier upon operation in a bust mode.

DISCLOSURE

Technical Problem

To solve the problems as described above, an aspect of the present invention is to provide a burst mode oscillation apparatus which oscillates a burst mode by controlling peak outputs in a laser system.

To solve the problems as described above, another aspect of the present invention is to provide a burst mode oscillation method, by which a burst mode is oscillated by controlling peak outputs in a laser system.

Technical Solution

In accordance with one aspect of the invention, a burst mode oscillation apparatus for a laser system includes: a seed beam generator which receives electrical input signals having different pulse widths, modulates pulse widths and amplitudes of output light based on the pulse widths of the received electrical input signals, and outputs modulated pulse light; an amplifier which amplifies the modulated pulse light and outputs amplified pulse light; and a non-linear wavelength converter which converts wavelengths of the amplified pulse light and outputs wavelength-converted light.

In accordance with another aspect of the present invention, a burst mode oscillation method in a laser system includes: receiving electrical signals having different pulse widths: modulating pulse widths and amplitudes of output light based on at least one pulse width among the received electrical input signals to output modulated pulse light; amplifying the modulated pulse light to output amplified pulse light; and converting wavelengths of the amplified pulse light to output wavelength-converted light.

Advantageous Effects

The burst mode oscillation method in a laser system and the apparatus for the same according to the present invention may control not only formation of output pulses of final output light through wavelength conversion but also time-based characteristics of the pulses such as repetition rates and pulse widths at the same time, and does not employ an expensive optical modulator, thereby enabling fabrication of a small, lightweight laser system while ensuring economic feasibility. In addition, according to the present invention, it is possible to prevent damage of an amplification terminal, which can occur when pulses are not sent from a seed beam of an oscillator to an amplifier for a predetermined period of time upon modulation of various pulse widths and pulse output repetition rates to realize a burst mode in a laser system. In a pulse laser system, peak outputs are determined inversely proportional to the pulse widths at the same repetition rate as that of a constant average output. Even in this case, according to the present invention, it is possible to achieve modulation of the repetition rate and to provide pulse outputs of various configurations so as to be more effective for a high output laser system configured to convert wavelengths based on non-linearity effects.

BEST MODE

Figure 1:
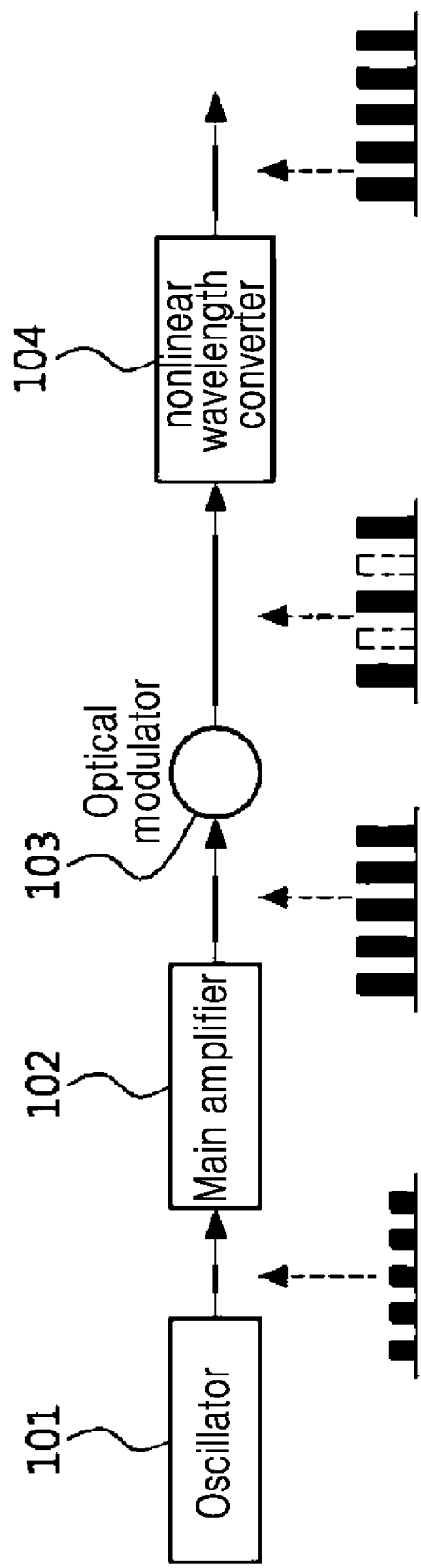
FIG. 1 is a block diagram of an internal structure of a burst mode oscillation apparatus of a typical laser system

The present may be realized by various embodiments, and some exemplary embodiments of the present invention will be described in detail with reference to the accompanying drawings. However, it should be understood that the present invention is not limited to the following embodiments, and that various modifications, substitutions, and equivalent embodiments can be made by those skilled in the art without departing from the spirit and scope of the present invention. The same components will be denoted by the same reference numerals throughout the drawings.

It will be understood that, although the terms "first", "second", "A", "B", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a "first" element or component discussed below could also be termed a "second" element or component, or vice versa, without departing from the scope of the present invention. As used herein, the term "and/or" includes any and all combinations of one or more of the associated listed items.

It will be understood that when an element is referred to as being "connected" to or "on" another element, it can be directly on the other element, or intervening elements may also be present. In contrast, when an element is referred to as being "directly connected" to or "directly on" or another element, there are no intervening elements present.

The terminology is used herein for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups.

Unless otherwise defined herein, all terms including technical or scientific terms used herein have the same meanings as commonly understood by those skilled in the art to which the present invention belongs. It will be further understood that terms, such as those defined in commonly used dictionaries, should be interpreted as having a meaning that is consistent with their meaning in the context of the specification and relevant art and should not be interpreted in an idealized or overly formal sense unless expressly so defined herein.

Hereinafter, exemplary embodiments of the present invention will be described in detail with reference to the accompanying drawings.

Figure 2:
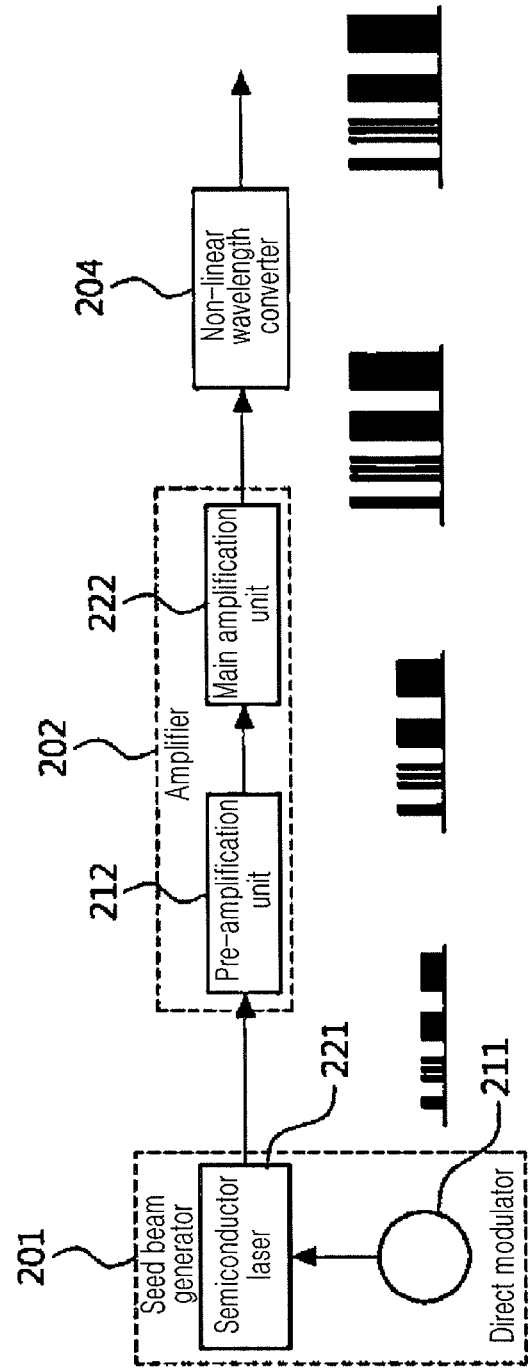
FIG. 2 is a block diagram illustrating a burst mode oscillation apparatus in a laser system in accordance with one embodiment of the present invention.

FIG. 2 is a block diagram illustrating a burst mode oscillation apparatus in a laser system in accordance with one embodiment of the present invention.

Referring to FIG. 2, the burst mode oscillation apparatus may include a seed beam generator 201, an amplifier 202, and a non-linear wavelength converter 204. The seed beam generator 201 may include a semiconductor laser 221 and a direct modulator 211, and the amplifier 202 may include a pre-amplification unit 212 and a main amplification unit 222.

The direct modulator 211 receives electrical input signals having different pulse widths, modulates pulse widths and amplitudes of output light based on the pulse widths of the received electrical input signals, and outputs modulated pulse light to the semiconductor laser 221. According to the embodiment of the invention, the direct modulator 211 receives the electrical input signals having different pulse widths, and the light signals having the pulse widths modulated based on the received input signals are output after being amplified through the pre-amplification unit and the main amplification unit, so that the peak outputs of the output signals are determined inversely proportional to the magnitude of the shortest pulse width at the same repetition rate. That is, a light pulse having the shortest pulse width will have the highest peak output.

In addition, the direct modulator 211 modulates the received electrical input signals such that output light having short pulse widths among the different pulse widths finally has high amplitudes. Thus, in the light pulses having the same amplitude, since light signals having different peak outputs are transferred to the non-linear wavelength converter 204 through modulation of the pulse widths thereof, it is possible to control the light pulses finally output from the laser system based on a principle that only light signals having a critical peak value or more for wavelength-conversion is allowed to be subjected to wavelength-conversion in the non-linear wavelength converter using only pulse width modulation, and wavelength conversion of light signals having a peak value less than the critical value is suppressed. Here, the procedure of outputting wavelength-converted light will be described in more detailed in description of the non-linear wavelength converter 204 described below.

The semiconductor laser 221 receives the modulated pulse signals from the direct modulator 211 and transfers the pulse signals to the amplifier 202. The pre-amplification unit 212 amplifies the modulated pulse light received from the semiconductor laser 211, and the main amplification unit 222 amplifies the pulse light amplified by the pre-amplification unit 212 and outputs the amplified pulse light to the non-linear wavelength converter 204. Here, since the amplifier 202 amplifies the input light having the same repetition rate and different pulse widths received from the direct modulator 211, it is possible to perform amplification without unstable operation of the amplifier due to the absence of modulated pulse light and physical damage due to abnormal over-amplification of a light pulse signal first amplified after the absence of amplified light for a long period of time, which occurs in realization of a bust mode in a typical MOPA structure. Therefore, the amplifier 202 may prevent physical damage due to pulse signals which are not received from the seed beam generator 201.

The non-linear wavelength converter 204 receives the amplified pulse light from the amplifier 202, converts the wavelengths of the amplified pulse light, and outputs wavelength-converted light. Here, since the wavelength-converted light output from the non-linear wavelength converter 204 is generated proportional to the square of the intensity of a laser beam input into a non-linear optical system, the peak outputs of pulse light having wide pulse widths are lower than the peak outputs of pulse light having narrow pulse widths. Thus, when the peak outputs of the pulse light having wide pulse widths are less than or equal to a predetermined critical value, wavelength conversion of the pulse light cannot be achieved, or the amplitudes of the wavelength-converted output light become very low as compared with those of the input light.

Figure 3:
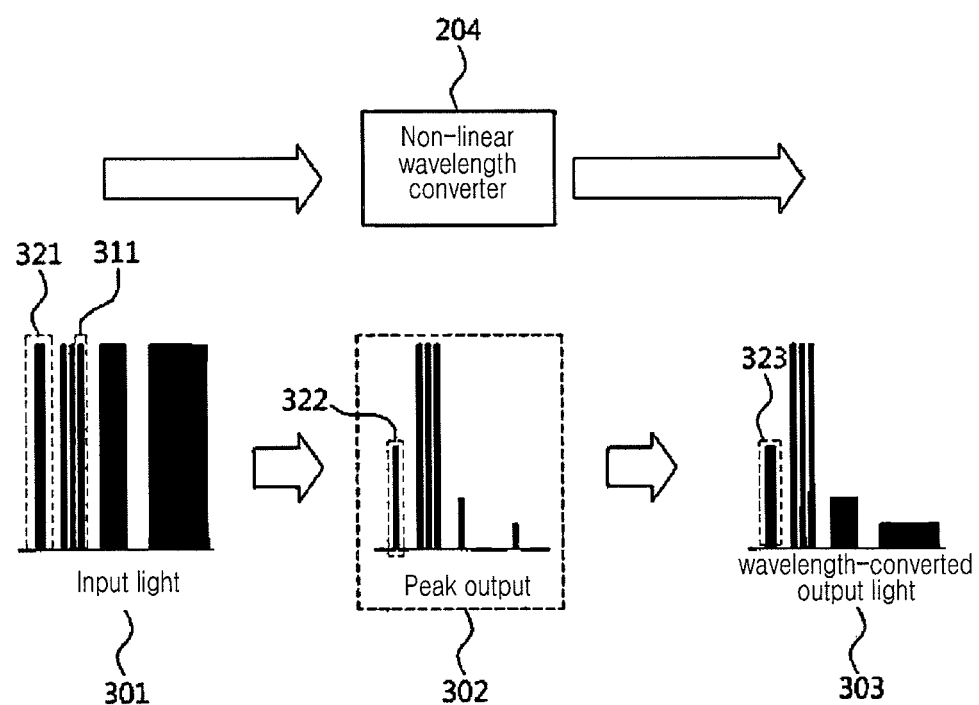
FIG. 3 is a diagram of a process of receiving input light and outputting wavelength-converted light in a non-linear wavelength converter 204 of the burst mode oscillation apparatus in the laser system in accordance with the embodiment of the present invention.

FIG. 3 is a diagram of a process of receiving input light and outputting wavelength-converted light in the non-linear wavelength converter 204 of the burst mode oscillation apparatus in the laser system according to the embodiment of the present invention Referring to FIG. 3, the direct modulator 211 receives electrical input signals 301 having different pulse widths, modulates pulse widths and amplitudes of output light based on the received electrical input signals 301, and outputs modulated pulse light to the semiconductor laser 211. According to the embodiment of the present invention, the direct modulator 211 receives the electrical input signals 301 having different pulse widths and generates optical signals having the same repetition rate and different pulse widths based on the received electrical input signals 301. At this point, the peak outputs of the light pulses output from the terminal amplifier are inversely proportional to the pulse widths. That is, the light pulse having the shortest pulse width has the highest peak output.

According to the embodiment, when the direct modulator 211 determines a value of less than ½ of the highest peak output as a critical value for wavelength-conversion in the non-linear wavelength converter based on the magnitude of the shortest pulse width at the same pulse repetition rate among the different pulse widths of the received electrical input signals 301, only light pulses of pulse widths twice greater than the shortest pulse width 311 among the light signals input into the final wavelength converter will be subjected to wavelength conversion.

Accordingly, the direct modulator 211 allows selective wavelength conversion of the light pulses through modulation of the pulse widths of the received electrical input signals upon final wavelength conversion, thereby enabling modulation of the wavelength-converted light signals.

Here, since the wavelength converter 204 receives the electrical input signals sent from the direct modulator 211 and amplifies the pulse widths thereof, the wavelength converter 204 may perform amplification without suffering from problems due to the absence of the modulated pulse light. As such, since it is possible to achieve time-based selection of the light pulses upon final wavelength conversion through simple modulation of the pulse widths by the direct modulator of the signal generator, in realization of burst mode oscillation in a typical pulse type amplifier, large amounts of energy may be accumulated inside the amplifier during the absence of received light pulse signals in light pulse arrays irregularly received from the seed beam generator 201 and may prevent physical damage of the amplifier due to over-amplification of subsequent pulses input to the amplifier.

The non-linear wavelength converter 204 receives the amplified pulse light from the amplifier 202, converts the wavelengths of the amplified pulse light, and outputs wavelength-converted light. Here, since the wavelength-converted output light from the non-linear wavelength converter 204 is proportional to the square of the intensity of the laser beam input into the non-linear optical system, the amplitudes of the wavelength-converted output light become much lower than those of the input light when the peak outputs, that is, short pulse widths, are less than or equal to a predetermined critical value. Through this procedure, it becomes possible to realize the burst mode that enables arbitrary modulation of the wavelength-converted output light through adjustment of only the pulse widths without changing the amplitudes of the light signals.

Next, a burst mode oscillation method based on non-linear wavelength conversion in a laser system according to one embodiment of the present invention will be described in more detail with reference to FIG. 4.

Figure 4:
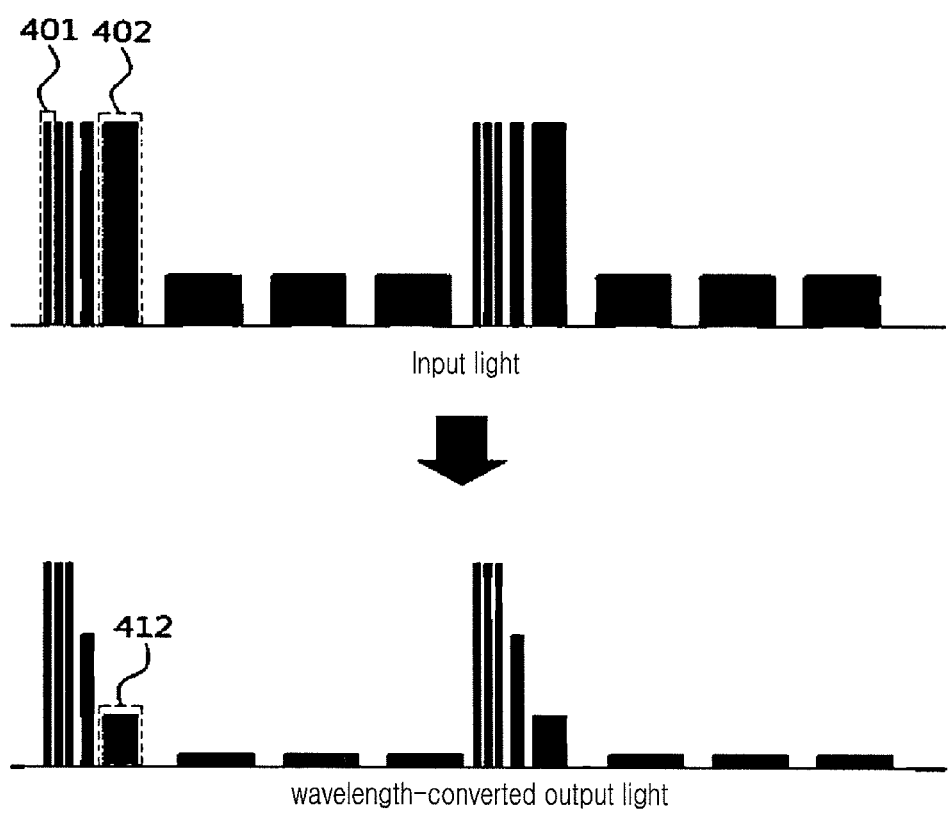
FIG. 4 is a diagram of a burst mode oscillation method based on non-linear wavelength conversion in a laser system in accordance with one embodiment of the present invention.

FIG. 4 is a diagram of a burst mode oscillation method based on non-linear wavelength conversion in a laser system in accordance with one embodiment of the present invention.

Referring to FIG. 4, the direct modulator 211 receives electrical input signals having different pulse widths, modulates pulse widths and amplitudes of output light based on the received electrical input signals, and outputs modulated pulse light to the semiconductor laser 221. According to the embodiment of the invention, the direct modulator 211 receives the electrical input signals having different pulse widths and modulates the output light based on the received electrical input signals, and the modulated output light is output through the pre- and main amplification units, so that final output light has peak outputs inversely proportional to the pulse widths of the output light. Then, the output light is input into the non-linear wavelength converter, in which light signals having peak outputs greater than or equal to a predetermined critical peak value for wavelength conversion are subjected to wavelength conversion, and light signals having peak outputs less than (or equal to) the predetermined critical value are not subjected to wavelength conversion. As a result, it is possible to achieve selection of light signals to be subjected to wavelength conversion through pulse width modulation without time-based modulation of the amplitudes of the light signals, unlike a typical method using an exterior modulator for realization of burst mode oscillation.

According to the present invention, it is possible to achieve arbitrary stable modulation of the wavelength-converted output light while allowing accumulated energy in the amplifier to suppress physical damage of the light amplifier due to over-amplification of a light pulse signal first amplified after the absence of light signals for a certain period of time, which can cause physical damage of the pulse-type light amplifier.

Figure 5:
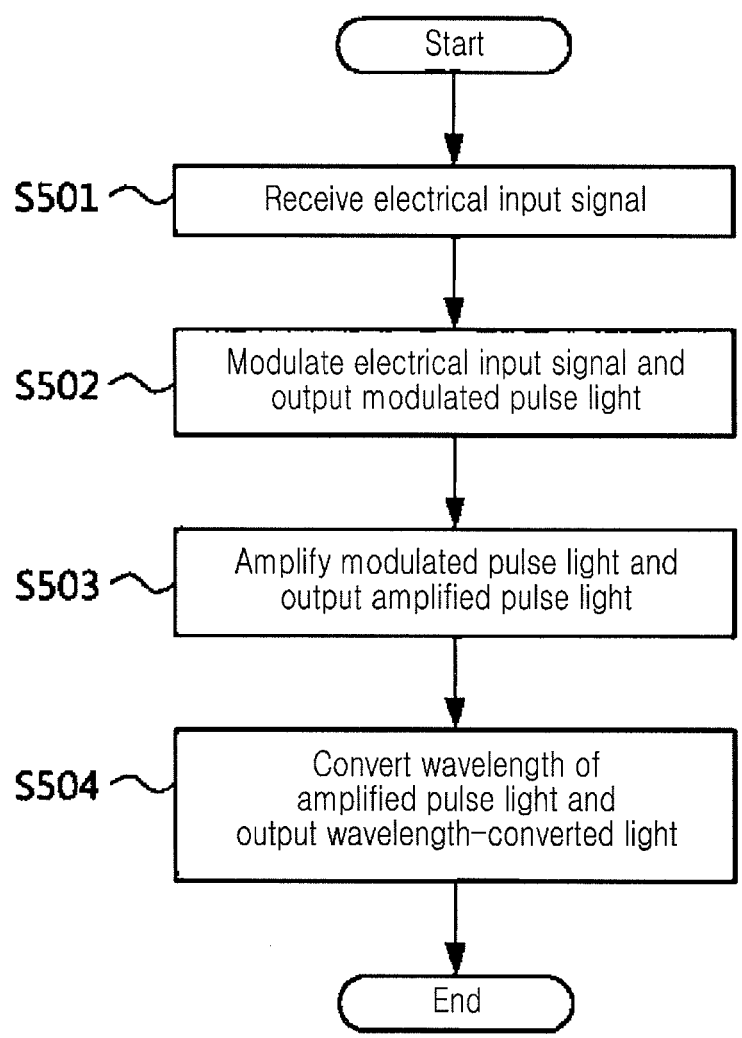
FIG. 5 is a flowchart of the burst mode oscillation method in a laser system in accordance with the embodiment of the present invention.

Next, the burst mode oscillation method in a laser system according to the embodiment will be descried in more detail with reference to FIG. 5.

FIG. 5 is a flowchart of the burst mode oscillation method in a laser system in accordance with the embodiment of the present invention.

Referring to FIG. 5, a burst mode oscillation apparatus receives electrical input signals having different pulse widths (S501), and modulates pulse widths and amplitudes of output light based on the received electrical input signals and outputs modulated pulse light (S502). According to the embodiment of the invention, the burst mode oscillation apparatus generates pulses having different peak outputs at the same repetition rate according to the different pulse widths in the final amplification unit and achieves wavelength conversion of the pulse light with different efficiency according to the peak outputs in a wavelength conversion optical system, whereby a burst mode can be realized to allow control of final output pulses through wavelength conversion when uniform pulse arrays are input without the absence of the modulated pulse light.

The burst mode oscillation apparatus amplifies the modulated pulse light and outputs amplified pulse light (S503). Here, since the amplifier 202 amplifies the input light having the same repetition rate and different pulse widths received from the direct modulator 211, it is possible to perform amplification without unstable operation of the amplifier due to the absence of the modulated pulse light and physical damage due to abnormal over-amplification of a light pulse signal first amplified after the absence of the amplified light for a long period of time, which occurs in realization of the burst mode in a typical MOPA structure. Therefore, the amplifier 202 may prevent physical damage due to pulse signals which are not received from the seed beam generator 201.

The burst mode oscillation apparatus converts the wavelengths of the amplified pulse light and outputs wavelength-converted light (S504). Here, the wavelength-converted output light is generated proportional to the square of the intensity of the laser beam input into the non-linear optical system. Thus, when the peak outputs of the light having wide pulse widths are less than or equal to a predetermined critical value, wavelength conversion of the pulse light is not allowed, or the amplitudes of the wavelength-converted output light become very low as compared with those of the input light.

Although some embodiments have been described with reference to the drawings, it should be understood that the present invention is not limited to these embodiments, and that various modifications, changes, and alterations can be made without departing from the spirit and scope of the invention. Therefore, the scope of the invention should be limited only by the accompanying claims and equivalents thereof.

The invention claimed is:

1. A burst mode oscillation apparatus for a laser system, comprising:
   a seed beam generator having a laser and a direct modulator,
   where the direct modulator is configured to receive electrical input signals having different pulse widths, to modulate the received electrical input signals to generate modulated light signals having the same repetition rate and different pulse widths, and to output the modulated light signals to the laser;
   an amplifier configured to amplify the modulated light signals and output amplified pulse light; and
   a non-linear wavelength converter configured to convert wavelengths of the amplified pulse light and output wavelength-converted light,
   wherein the direct modulator determines a critical value for the wavelength conversion based on a magnitude of the shortest pulse width; and
   wherein wavelength conversion is not performed when the modulated light signals have peak outputs less than or equal to the critical value or the wavelength-converted light has lower amplitudes than the amplified pulse light.

2. The burst mode oscillation apparatus according to claim 1, wherein the peak outputs of the modulated light signals are determined by the seed beam generator as inversely proportional to the magnitude of the shortest pulse width.

3. The burst mode oscillation apparatus according to claim 1, wherein the wavelength-converted light is generated proportional to the square of an intensity of the electrical input signals.

4. A burst mode oscillation method in a laser system, comprising:
   receiving electrical signals having different pulse widths;
   modulating the received electrical input signals to generate modulated light signals, having the same repetition rate and different pulse widths, to control a peak output, and outputting the modulated light signals;
   determining a critical value for wavelength conversion based on a magnitude of the shortest pulse width;
   amplifying the modulated light signals to output amplified pulse light; and
   converting wavelengths of the amplified pulse light to output wavelength-converted light,
   wherein wavelength conversion is not performed when the modulated light signals have peak outputs less than or equal to the critical value or the wavelength-converted light has lower amplitudes than the amplified pulse light.

5. The burst mode oscillation method according to claim 4, wherein the peak outputs of the modulated light signals are determined as inversely proportional to the magnitude of the shortest pulse width.

6. The burst mode oscillation method according to claim 4, wherein the wavelength-converted light is generated proportional to the square of an intensity of the electrical input signals.

* * * * *